(12) United States Patent
Noda

(10) Patent No.: US 7,138,322 B2
(45) Date of Patent: Nov. 21, 2006

(54) SEMICONDUCTOR DEVICE AND FABRICATION METHOD THEREFOR

(75) Inventor: Taiji Noda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/775,122

(22) Filed: Feb. 11, 2004

(65) Prior Publication Data

US 2004/0173843 A1 Sep. 9, 2004

(30) Foreign Application Priority Data

Mar. 4, 2003 (JP) .............................. 2003-056860

(51) Int. Cl.
*H01L 21/265* (2006.01)
*H01L 21/425* (2006.01)
*H01L 21/22* (2006.01)
(52) U.S. Cl. ..................... 438/519; 438/514; 438/516; 438/546; 257/E21.135
(58) Field of Classification Search ............... 438/546, 438/663
See application file for complete search history.

(56) References Cited

U.S. PATENT DOCUMENTS

| 5,966,623 | A | * | 10/1999 | Khosla et al. .............. 438/471 |
| 6,069,062 | A | | 5/2000 | Downey |
| 6,261,889 | B1 | | 7/2001 | Ono |
| 6,432,802 | B1 | * | 8/2002 | Noda et al. ................. 438/585 |
| 6,437,406 | B1 | | 8/2002 | Lee |
| 6,455,385 | B1 | | 9/2002 | Alvis et al. |
| 6,808,997 | B1 | * | 10/2004 | Jain et al. ................... 438/305 |

FOREIGN PATENT DOCUMENTS

| JP | 04-085926 | 3/1992 |
| JP | 08-181311 | 7/1996 |
| JP | 2000-269492 | 9/2000 |
| JP | P2002-76136 | 3/2002 |

OTHER PUBLICATIONS

Der-Gao Lin et al., "The Effect of Fluorine on MOSFET Channel Length", Oct. 1, 1993, IEEE Electron Device Letters, IEEE Service Center, New York, NY pp. 469-471, XP000397398.

* cited by examiner

*Primary Examiner*—Michael Lebentritt
*Assistant Examiner*—Cheung Lee
(74) *Attorney, Agent, or Firm*—McDermott Will & Emery LLP

(57) ABSTRACT

An n-type channel diffused layer and an n-type well diffused layer are formed in the top portion of a semiconductor substrate, and a gate insulating film and a gate electrode are formed on the semiconductor substrate. Using the gate electrode as a mask, boron and arsenic are implanted to form p-type extension implanted layers and n-type pocket impurity implanted layers. Fluorine is then implanted using the gate electrode as a mask to form fluorine implanted layers. The resultant semiconductor substrate is subjected to rapid thermal annealing, forming p-type high-density extension diffused layers and n-type pocket diffused layers. Sidewalls and p-type high-density source/drain diffused layers are then formed.

14 Claims, 9 Drawing Sheets

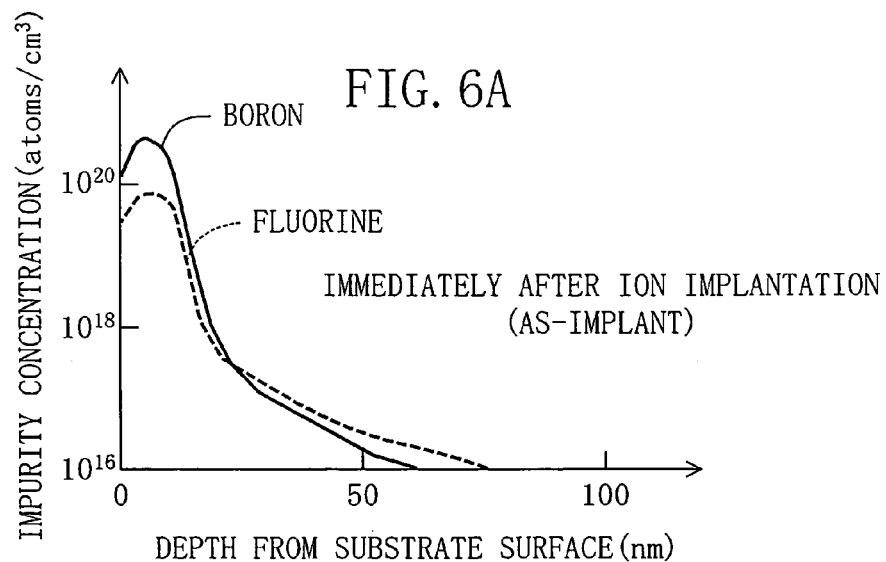
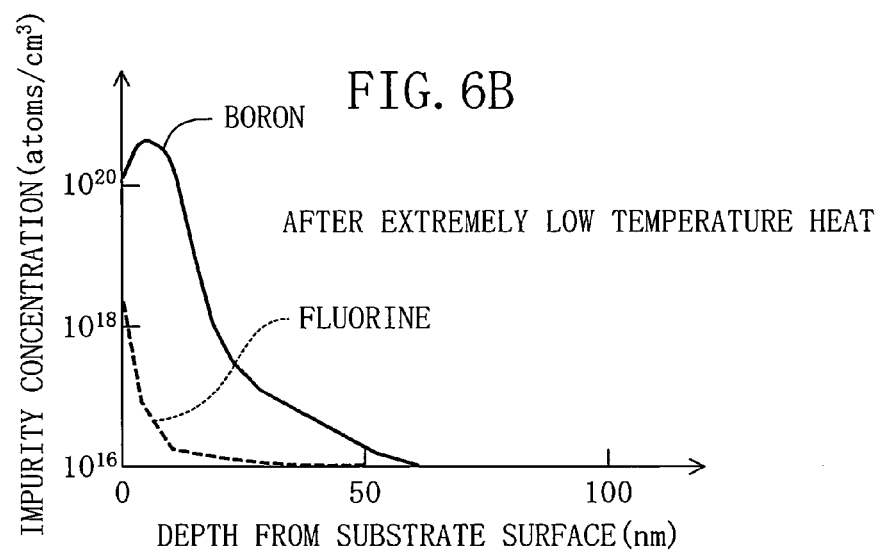
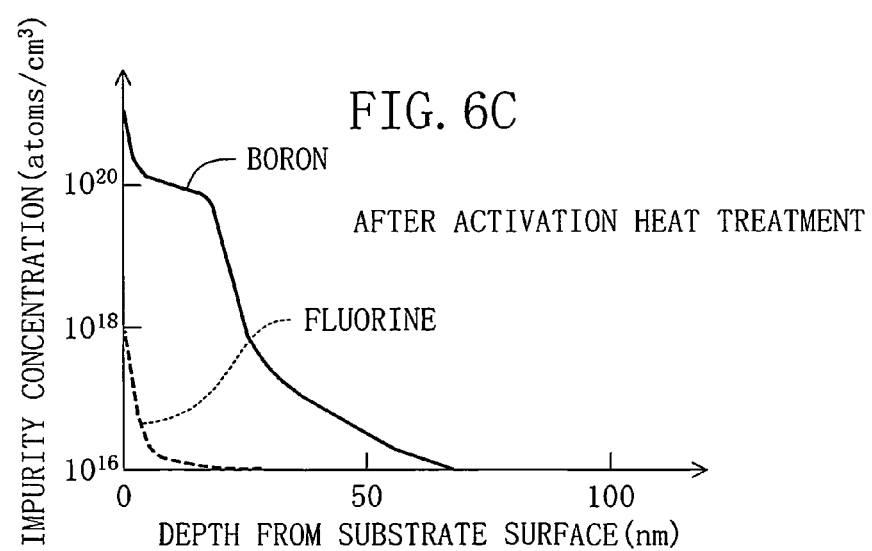

SEMICONDUCTOR DEVICE AND FABRICATION METHOD THEREFOR

BACKGROUND OF THE INVENTION

The present invention relates to a semiconductor device and a fabrication method for the same. In particular, the present invention relates to a semiconductor device that can be made finer and also has shallow-junction, low-resistance diffused layers, and a fabrication method for such a semiconductor device.

With the tendency of higher integration of semiconductor integrated circuits, finer MIS transistors have been demanded. To respond to this demand, MIS transistors having shallow-junction, low-resistance extension diffused layers are required.

A conventional fabrication method for a semiconductor device will be described with reference to FIGS. 9A to 9E (see Japanese Laid-Open Patent Publication No. 2002-76136, for example).

FIGS. 9A to 9E are cross-sectional views for sequentially illustrating process steps of a conventional fabrication method for a semiconductor device.

In the step shown in FIG. 9A, arsenic (As) ions and phosphorus (P) ions as n-type impurities are implanted in a p-type semiconductor substrate 200. The resultant substrate is subjected to heat treatment, to form an n-type channel diffused layer 203 containing arsenic impurities in the top portion of the semiconductor substrate 200 and an n-type well layer 204 containing phosphorus impurities in a portion under the n-type channel diffused layer 203.

In the step shown in FIG. 9B, a silicon oxide film and a polysilicon film are sequentially formed on the resultant semiconductor substrate 200, and then patterned by photolithography and dry etching, to form a gate oxide film 201 and a gate electrode 202.

In the step shown in FIG. 9C, As ions as n-type impurities are implanted in the semiconductor substrate 200 using the gate electrode 202 as a mask, to form n-type pocket implanted layers 207A. Subsequently, boron (B) as p-type impurities are implanted in the semiconductor substrate 200 using the gate electrode 202 as a mask, to form p-type extension implanted layers 206A.

In the step shown in FIG. 9D, a silicon nitride film is deposited over the entire top surface of the semiconductor substrate 200 and then etched by anisotropic etching, to form sidewalls 208 on the walls of the gate electrode 202.

In the step shown in FIG. 9E, boron difluoride ($BF_2$) molecular ions as p-type impurities are implanted in the semiconductor substrate 200, to form high-density source/drain implanted layers. The resultant substrate is subjected to high-temperature, short-time heat treatment, to form p-type high-density source/drain diffused layers 205, p-type extension diffused layers 206 and n-type pocket diffused layers 207.

In the conventional fabrication method for a semiconductor device, the boron implantation energy for formation of the p-type extension implanted layers 206A is made lower than usual in the process of forming the p-type extension diffused layers 206, to thereby attain a shallow junction.

As described above, in the conventional fabrication method for a semiconductor device, boron is implanted in the semiconductor substrate 200 under low-energy, high-dose implantation conditions, to form the p-type extension implanted layers 206A having a shallow junction.

The conventional method described above however has a problem as follows. During the high-temperature, short-time heat treatment performed after the boron implantation, boron in the semiconductor substrate 200 is subjected to a phenomenon of transient enhanced diffusion (hereinafter, referred to as TED). Due to the TED, boron is diffused deep into a region beyond a predetermined junction in the semiconductor substrate 200, and this results in failure to give a desired impurity profile to the p-type extension diffused layers 206. The transient enhanced diffusion (TED) as used herein refers to an abnormal diffusion phenomenon in which impurity atoms interact with excessive point defects such as interstitial silicon atoms and atomic vacancies existing in the semiconductor substrate, resulting in enhancement of diffusion of the impurity atoms. The excessive point defects are mainly introduced by implantation damage occurring during ion implantation in many cases.

Hence, in the conventional fabrication method for a semiconductor device described above, even though the ion implantation energy is lowered to attain a shallower junction, the TED of implanted dopants increases. Therefore, it is difficult to form MIS transistors having shallow-junction, low-resistance extension diffused layers only by implanting ions of a single element at a low energy.

SUMMARY OF THE INVENTION

An object of the present invention is providing a semiconductor device having high-density extension diffused layers having a shallow junction and low resistance, and a fabrication method for such a semiconductor device.

To attain the above object, in the fabrication method for a semiconductor device of the present invention, fluorine is implanted after impurities for formation of extension diffused layers are implanted, to allow the implanted fluorine to react with interstitial silicon atoms that may enhance diffusion of the implanted impurities. This reduces the number of such interstitial silicon atoms, and in this way, shallow-junction, low-resistance extension diffused layers can be formed.

Specifically, the fabrication method for a semiconductor device of the present invention includes the steps of: (a) forming a gate electrode on a semiconductor region of a first conductivity type with a gate insulating film interposed therebetween; (b) forming extension implanted layers in the semiconductor region by implanting first impurities of a second conductivity type in the semiconductor region using the gate electrode as a mask; (c) after the step (b), forming fluorine implanted layers in the semiconductor region by implanting fluorine in the semiconductor region using the gate electrode as a mask; and (d) after the step (c), forming extension diffused layers of the second conductivity type made from diffusion of the first impurities in top portions of the semiconductor region by performing first heat treatment.

That is, extension implanted layers are first formed by implanting first impurities using the gate electrode formed on the semiconductor region via the gate insulating film as a mask. Fluorine implanted layers are then formed by implanting fluorine. Thereafter, heat treatment is performed for activating the first impurities in the extension implanted layers.

According to the fabrication method for a semiconductor device of the present invention, the fluorine ions in the fluorine implanted layers in the semiconductor region rapidly diffuse while reacting with point defects that may cause transient enhanced diffusion (TED) of impurities during heat treatment. This reduces the number of excessive point defects that are supposed to interact with the impurities, and thus suppresses the TED of the impurities. As a result, shallow, low-resistance extension diffused layers can be formed. In addition, when the impurity element is boron, implanted boron ions are known to react with interstitial silicon atoms to produce boron-interstitial silicon clusters and be inactivated. By the reduction of the number of excessive point defects, the production of boron-interstitial silicon clusters is suppressed. Thus, this inactivation of boron can also be suppressed.

In the fabrication method for a semiconductor device described above, preferably, the dose of fluorine in the step (c) is not less than $1 \times 10^{13}/cm^2$ and also in a level at which the semiconductor region is kept from becoming amorphous. This prevents production of an end of range (EOR) defect in the vicinity of an amorphous-crystal interface formed immediately after ion implantation.

In the case described above, the dose of fluorine in the step (c) is preferably less than $3 \times 10^{14}/cm^2$.

In the fabrication method of the present invention, the implantation projected range of fluorine in the step (c) is preferably roughly the same as the implantation projected range of the first impurities in the step (b).

In the fabrication method of the present invention, preferably, the step (b) includes the step of forming pocket implanted layers in the semiconductor region by implanting second impurities of the first conductivity type in the semiconductor region using the gate electrode as a mask, and in the step (d), pocket diffused layers of the first conductivity type made from diffusion of the second impurities are formed in portions of the semiconductor region under the extension diffused layer by performing the first heat treatment.

Preferably, the fabrication method of the present invention further includes, after the step (d), the steps of: (e) forming sidewalls made of an insulating film on walls of the gate electrode; (f) forming source/drain implanted layers in the semiconductor region by implanting third impurities of the second conductivity type in the semiconductor region using the gate electrode and the sidewalls as a mask; and (g) after the step (f), forming source/drain diffused layers of the second conductivity type made from diffusion of the third impurities in portions of the semiconductor region on the outer side of the sidewalls.

In the fabrication method of the present invention, preferably, in the step (d), the fluorine in the fluorine implanted layers diffuses while interacting with point defects, so that excessive point defects induced in the semiconductor region are removed.

Preferably, the fabrication method of the present invention further includes the step of: performing extremely low temperature heat treatment for the semiconductor region before the step (d) and after the step (c), to recover crystal damage produced in the semiconductor region due to the implantation of the first impurities and the fluorine without substantially allowing diffusion of the first impurities in the extension implanted layer.

In the case described above, the extremely low temperature heat treatment preferably has a heating temperature of 400° C. to 600° C.

In the fabrication method of the present invention, preferably, the first heat treatment in the step (d) is rapid thermal annealing in which the temperature rise rate is about 100° C./s or more, the temperature drop rate is about 80° C./s or more, the heating temperature is about 850° C. to 1050° C., and the peak temperature is held for about ten seconds at the longest or is not held at all.

In the fabrication method of the present invention, the first impurities in the step (b) are preferably boron or indium.

In the fabrication method of the present invention, the first impurities in the step (b) are preferably arsenic.

In the case described above, preferably, during the first heat treatment in the step (d), the first impurities in the extension implanted layers diffuse in a state in which the fluorine has captured atomic vacancies produced in top portions of the semiconductor region.

In the fabrication method of the present invention, preferably, the dose for the implantation of the first impurities in the step (b) is in a level at which the semiconductor region is kept from becoming amorphous, and the extension diffused layers having a predetermined impurity concentration are formed by repeating a series of process steps composed of implanting the first impurities in the step (b), implanting fluorine in the step (c) and performing the first heat treatment in the step (d).

The semiconductor device of the present invention includes: a gate electrode formed on a semiconductor region of a first conductivity type with a gate insulating film formed therebetween; and extension diffused layers of a second conductivity type formed in portions of the semiconductor region on the sides of the gate electrode, wherein the extension diffused layers are crystal layers that contain fluorine and are free from residual defects.

BRIEF DESCRIPTION OF THE DRAWINGS

FIGS. 6A to 6C are graphs showing impurity profiles in the depth direction from the surface of a semiconductor substrate in some steps of the fabrication method of Embodiment 2 of the present invention, in which FIGS. 6A, 6B and 6C respectively show the impurity profiles observed immediately after ion implantation, immediately after extremely low temperature heat treatment, and immediately after activation heat treatment.

DESCRIPTION OF THE PREFERRED EMBODIMENTS

Hereinafter, preferred embodiments of the present invention will be described with reference to the accompanying drawings.

(Embodiment 1)

FIGS. 1A to 1D and 2A to 2D are cross-sectional views for sequentially illustrating process steps of a fabrication method for a semiconductor device of Embodiment 1 of the present invention.

Figure 1A:
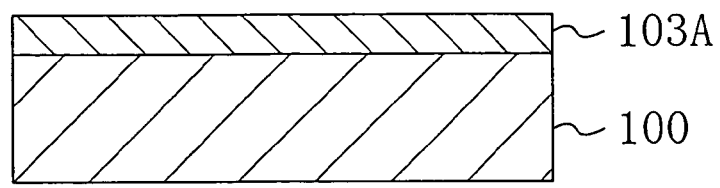
FIGS. 1A to 1D are cross-sectional views for sequentially illustrating process steps of a fabrication method for a semiconductor device of Embodiment 1 of the present invention.

First, as shown in FIG. 1A, arsenic (As) ions as n-type impurities are implanted in a channel formation region of a semiconductor substrate 100 made of p-type silicon under the conditions of an implantation energy of 140 keV and an implantation dose of $5 \times 10^{12}/cm^2$, to form an n-type channel implanted layer 103A in the top portion of the semiconductor substrate 100. Subsequently, phosphorus (P) ions as n-type impurities are implanted in an n-type well formation region of the semiconductor substrate 100 twice, first under the first implantation conditions of an implantation energy of 260 keV and an implantation dose of $1 \times 10^{13}/cm^2$ and then under the second implantation conditions of an implantation energy of 540 keV and an implantation dose of $1 \times 10^{13}/cm^2$, to form an n-type well implanted layer (not shown) in a portion of the semiconductor substrate 100 under the n-type channel implanted layer 103A.

Figure 1B:
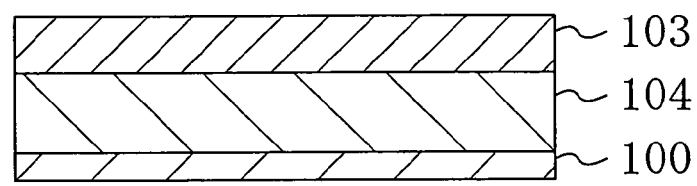

As shown in FIG. 1B, the semiconductor substrate 100 having the n-type channel implanted layer 103A and the n-type well implanted layer is subjected to first rapid thermal annealing (RTA) in which the temperature of the semiconductor substrate 100 is raised to about 850° C. to about 1050° C. at a rise rate of about 100° C./s or more, preferably about 200° C./s, and then the peak temperature is held for ten seconds at the longest or is not held at all. With this first RTA, an n-type channel diffused layer 103, made from diffusion of the arsenic ions implanted in the n-type channel implanted layer 103A, is formed in the top portion of the semiconductor substrate 100. Simultaneously, an n-type well diffused layer 104, made from diffusion of the phosphorus ions implanted in the n-type well implanted layer, is formed in a portion under the n-type channel diffused layer 103 to be in contact with the n-type channel diffused layer 103. Note herein that the rapid thermal annealing involving no holding of the peak temperature refers to a kind of heat treatment in which the heat treatment temperature is lowered as soon as it reaches the peak.

Figure 1C:
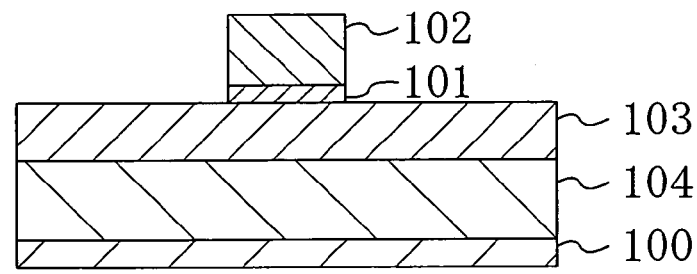

As shown in FIG. 1C, a silicon oxide film having a thickness of about 1.5 nm is formed on the semiconductor substrate 100 by thermal oxidation, for example, and subsequently a polysilicon film having a thickness of about 150 nm is formed on the silicon oxide film by chemical vapor deposition (CVD). The silicon oxide film and the polysilicon film are then patterned by photolithography and dry etching, to form a gate insulating film 101 and a gate electrode 102, respectively. As the etching gas, a gas containing chlorine as a main ingredient is used for the polysilicon film, and a gas containing fluorocarbon as a main ingredient is used for the silicon oxide film. In place of the silicon oxide film, a silicon oxide nitride (SiON) film or a high dielectric insulating film (high-k film) such as a hafnium oxide ($HfO_x$) film may be used as the gate insulating film 101. In place of the polysilicon film, a so-called polymetal film in which a metal film is formed on polysilicon may be used as the gate electrode 102.

Figure 1D:
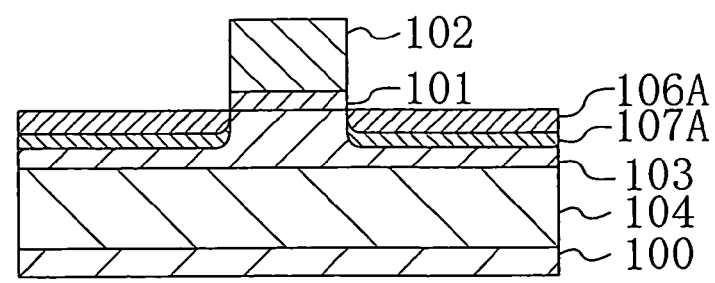

As shown in FIG. 1D, boron (B) ions as p-type impurities are implanted in the semiconductor substrate 100 using the gate electrode 102 as a mask under the conditions of an implantation energy of 1 keV and an implantation dose of $3 \times 10^{14}/cm^2$, to form p-type extension implanted layers 106A in regions of the semiconductor substrate 100 on both sides of the gate electrode 102. Subsequently, arsenic (As) ions as n-type impurities are implanted in the semiconductor substrate 100 using the gate electrode 102 as a mask under the conditions of an implantation energy of 50 keV to 150 keV, preferably 80 keV and an implantation dose of $4 \times 10^{13}/cm^2$, to form n-type pocket impurity implanted layers 107A in regions of the semiconductor substrate 100 under the p-type extension implanted layers 106A. The p-type extension implanted layers 106A and the n-type pocket impurity implanted layers 107A are preferably shallower than the junction of the n-type channel diffused layer 103. The dose of boron ions for formation of the p-type extension implanted layers 106A and the dose of arsenic ions for formation of the n-type pocket impurity implanted layers 107A are preferably amounts with which the semiconductor substrate 100 is kept from becoming amorphous.

In Embodiment 1, the boron-doped p-type extension implanted layers 106A are formed prior to the arsenic-doped n-type pocket impurity implanted layers 107A. In reverse, the n-type pocket impurity implanted layers 107A may be formed prior to the p-type extension implanted layers 106A. In this case, arsenic ions implanted previously can suppress channeling of boron ions implanted subsequently in the semiconductor substrate 100, and thus the implantation depth of the p-type extension implanted layers 106A can be further reduced.

Figure 2A:
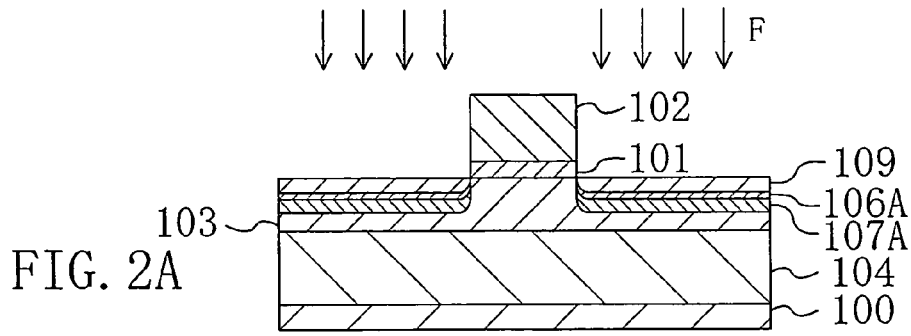
FIGS. 2A to 2D are cross-sectional views for sequentially illustrating process steps of the fabrication method for a semiconductor device of Embodiment 1 of the present invention.

As shown in FIG. 2A, fluorine (F) ions are then implanted in the semiconductor substrate 100 using the gate electrode 102 as a mask under the conditions of an implantation energy of 2 keV and an implantation dose of $5 \times 10^{13}/cm^2$, to form fluorine implanted layers 109 in the top portions of the p-type extension implanted layers 106A. The fluorine dose in this implantation should be not less than $1 \times 10^{13}/cm^2$ and also in the level at which the semiconductor substrate 100 is kept from becoming amorphous, preferably, less than $3 \times 10^{14}/cm^2$. The implantation projected range of fluorine should be less than five times as large as the range of boron in the formation of the p-type extension implanted layers 106A, preferably roughly the same as the range of boron.

Figure 2B:
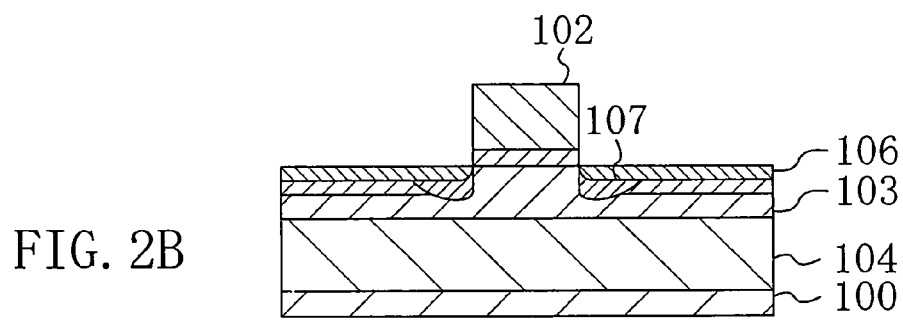

As shown in FIG. 2B, the resultant semiconductor substrate 100 is subjected to second rapid thermal annealing (RTA) in which the temperature of the semiconductor substrate 100 is raised to about 850° C. to about 1050° C. at a rise rate of about 100° C./s or more, preferably about 200° C./s, then the peak temperature is held for ten seconds at the longest or is not held at all, and the temperature is lowered at a drop rate of about 80° C./s. With the second RTA, p-type high-density extension diffused layers 106 having a shallow junction, made from diffusion of the boron ions contained in the p-type extension implanted layers 106A, are formed in regions of the semiconductor substrate 100 on both sides of the gate electrode 102. Simultaneously, n-type pocket diffused layers 107, made from diffusion of the arsenic ions contained in the n-type pocket implanted layers 107A, are formed in regions under the extension diffused layers 106 to be in contact with the extension diffused layers 106.

Figure 2C:
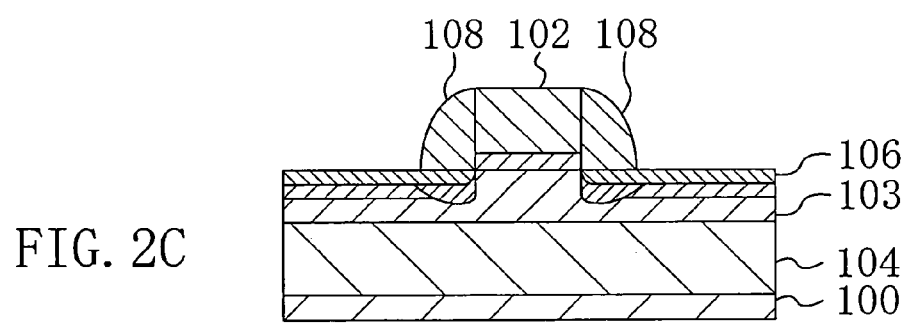

As shown in FIG. 2C, a silicon nitride film having a thickness of about 50 nm is deposited over the entire top surface of the semiconductor substrate 100 including the gate electrode 102 by CVD, for example. The deposited silicon nitride film is then subjected to anisotropy etching (etch-back) with a gas containing fluorocarbon as a main ingredient, to form sidewalls 108 made of the silicon nitride film on both walls of the gate electrode 102. In place of the silicon nitride film, a silicon oxide film or a silicon oxide nitride film may be used as the sidewalls 108. Otherwise, a laminate film composed of at least two films among a silicon nitride film, a silicon oxide film and a silicon oxide nitride film may be used.

Figure 2D:
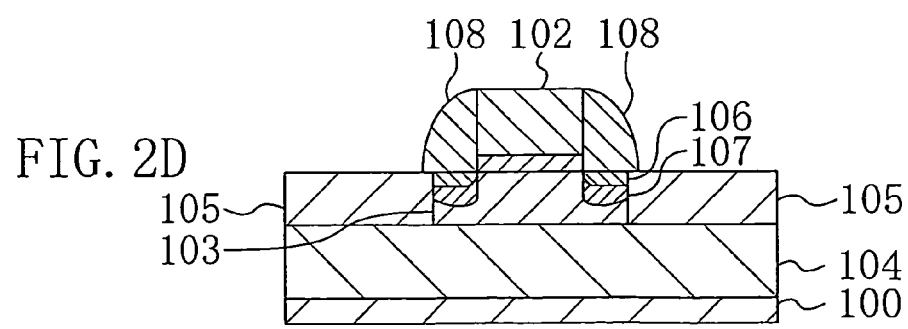

As shown in FIG. 2D, boron as p-type impurities are implanted in the semiconductor substrate 100 using the gate electrode 102 and the sidewalls 108 as a mask under the conditions of an implantation energy of 2 keV to 5 keV and an implantation dose of $3 \times 10^{15}/cm^2$, to form p-type high-density source/drain implanted layers in regions of the semiconductor substrate 100 on the outer sides of the sidewalls 108. The resultant semiconductor substrate 100 is subjected to third rapid thermal annealing (RTA) in which the temperature of the semiconductor substrate 100 is raised to about 850° C. to about 1050° C. at a rise rate of about 200° C./s to 250° C./s, and then the peak temperature is held for ten seconds at the longest or is not held at all. With the third RTA, p-type high-density source/drain diffused layers 105, made from diffusion of the boron ions in the high-density source/drain implanted layers, are formed in regions of the semiconductor substrate 100 on both outer sides of the sidewalls 108. The p-type high-density source/drain diffused layers 105 are connected with the p-type high-density extension diffused layers 106 and have a junction deeper than the extension diffused layers 106. The junction of the p-type high-density source/drain diffused layers 105 should also be deeper than the junction of the n-type pocket diffused layers 107. As a result, the p-type high-density extension diffused layers 106 and the n-type pocket diffused layers 107 exist only under the sidewalls 108.

The density of fluorine in the extension regions in Embodiment 1 is low after the formation of the p-type high-density source/drain diffused layers 105 shown in FIG. 2D, compared with the density immediately after the implantation of fluorine shown in FIG. 2A, due to out-diffusion of fluorine during the heat treatment such as the second RTA performed in between. A measurable amount of fluorine atoms however still remain in the surface portion of the semiconductor substrate 100.

As described above, in the fabrication method for a semiconductor device of Embodiment 1, boron ion implantation for formation of the p-type extension implanted layers 106A is performed at an energy as low as 1 keV, and then fluorine ion implantation for formation of the fluorine implanted layers 109 is performed at a dose ($5 \times 10^{13}/cm^2$) low enough to keep the semiconductor substrate from becoming amorphous. Thereafter, the boron ions in the p-type extension implanted layers 106A are activated by the second RTA.

The inventors of the present invention implanted fluorine ions in the top portion of the p-type extension implanted layer 106A prior to the heat treatment (annealing) for diffusing the boron ions as p-type impurities implanted in the p-type extension implanted layer 106A, to examine an influence of the implanted fluorine ions on the diffusion of the boron ions. As a result of this examination, the inventors have found that there are optimum values with which the TED of boron can be suppressed in the fluorine implantation conditions for formation of the fluorine implanted layers 109. This will be described with reference to FIGS. 3A and 3B.

Figure 3A:
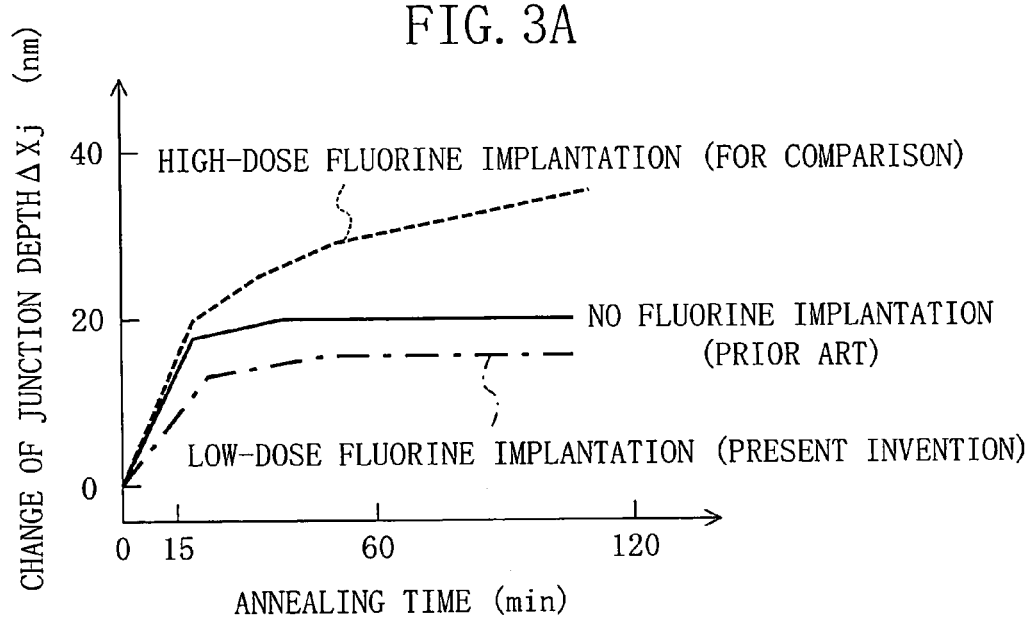
FIG. 3A is a graph showing the relationship between the junction depth of boron implanted in a semiconductor substrate and the annealing time.

FIG. 3A shows variations of the change of the junction depth ($\Delta X_j$) of boron with the annealing time. The change of the junction depth ($\Delta X_j$) as used herein refers to the difference between the junction depth of the implanted boron ions after the annealing and that immediately after the ion implantation. In the graph of FIG. 3A, the solid line represents the change of the junction depth normally observed when only boron ion implantation is performed with no implantation of fluorine and then annealing is performed. The one-dot chain line represents the change of the junction depth according to the present invention observed when fluorine is implanted at a dose low enough to keep the semiconductor substrate from becoming amorphous after the boron ion implantation and then annealing is performed. The broken line represents the change of the junction depth observed when fluorine is implanted at a dose high enough to allow the semiconductor substrate to become amorphous, which is more than twice as high as the dose of boron, and then annealing is performed, given for comparison. As is found from FIG. 3A, in the case represented by the broken line, the junction depth is greater as the annealing time is longer. This indicates that the TED was increasingly enhanced.

As is found from FIG. 3A, in the case according to the present invention in which fluorine is implanted at a dose low enough to keep the semiconductor substrate from becoming amorphous, diffusion of boron is suppressed, allowing formation of a shallower junction, compared with the case of implanting no fluorine. In the case of implanting fluorine at a dose high enough to allow the semiconductor substrate to become amorphous, boron diffuses more deeply than in the case of implanting no fluorine. Accordingly, a feature of the present invention is implanting fluorine under a condition with which diffusion of the boron in the p-type high-density extension diffused layers 106 can be suppressed surely, that is, at a dose with which the semiconductor substrate 100 is kept from becoming amorphous. By implanting fluorine under this condition, the TED of boron is suppressed during the heat treatment for formation of the p-type high-density extension diffused layers 106, and thus the p-type high-density extension diffused layers 106 having a shallow junction can be formed without fail. In addition, since diffusion of the boron toward the surface of the semiconductor substrate 100 is also suppressed, the boron dose loss is suppressed. Thus, the p-type high-density extension diffused layers 106 having low resistance can be attained.

Figure 3B:
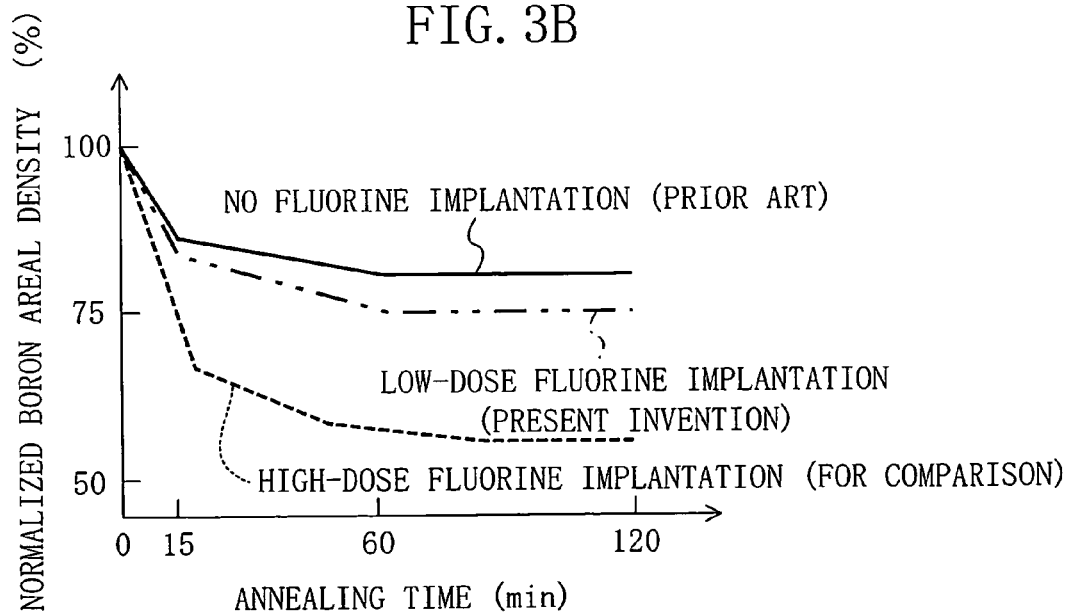
FIG. 3B is a graph showing the relationship between the density of boron implanted in the semiconductor substrate and the annealing time.

FIG. 3B shows variations of the normalized boron areal density in the semiconductor substrate with the annealing time. The normalized boron areal density as used herein refers to the percentage of the boron areal density in Si after the annealing with respect to the boron areal density in Si after the ion implantation. In FIG. 3B, the solid line represents the conventional case of implanting no fluorine. The two-dot chain line represents the case according to the present invention in which fluorine is implanted at a low dose and then annealing is performed. The broken line represents a case of implanting fluorine at a high dose, given for comparison.

As is found from FIG. 3B, the boron dose loss increases when fluorine is implanted in the semiconductor substrate at a high dose, as shown by the broken line. The increase of the boron dose loss can be suppressed by decreasing the dose of fluorine to as low as $1 \times 10^{14}/cm^2$ or less, for example, as shown by the two-dot chain line. Accordingly, the boron dose loss that occurs during the annealing after the boron implantation can be suppressed. Thus, the low-resistance, the p-type high-density extension diffused layers 106 having low resistance and a shallow junction can be formed without the necessity of unnecessarily increasing the dose for the p-type extension implanted layers 106A.

The fluorine in the fluorine implanted layers 109 rapidly diffuses toward the surface of the semiconductor substrate 100 and comes out thereof during the heat treatment. Therefore, the implantation projected range of fluorine during the formation of the fluorine implanted layers 109 should preferably be roughly equal to or a little deeper than the range of boron.

In Embodiment 1, the fluorine implanted layers 109 are formed after the formation of the p-type extension implanted layers 106A by low-energy boron implantation. Therefore, the impurity profile of the implanted boron is free from influence of the fluorine implantation, and this permits reliable design of the boron impurity profile.

In place of implanting boron and fluorine separately as described above, boron difluoride ($BF_2$) may be used to give simultaneous implantation of boron and fluorine. However, in use of boron difluoride, fluorine will be invariably implanted at a dose twice as high as the dose of boron. Therefore, if boron difluoride is implanted at a high dose to allow formation of the p-type high-density extension diffused layers 106, the density of the fluorine will be higher than an optimum value. This will make the semiconductor substrate 100 amorphous, and as a result, the effect of the present invention of suppressing boron diffusion will not be obtained.

In consideration of the above, the boron-doped p-type extension implanted layers 106A are first formed, and then fluorine is implanted under the implantation condition of a dose that is not less than $1\times10^{13}/cm^2$ and also in the level at which the semiconductor substrate 100 is kept from becoming amorphous, to form the fluorine implanted layers 109.

By following the above process steps, TED-induced abnormal diffusion of boron can be suppressed. This ensures formation of the low-resistance p-type high-density extension diffused layers 106 in which the boron impurity profile is steep, the junction is shallow, and increase in resistance value due to dose loss is suppressed. Thus, MIS transistors having such shallow-junction, low-resistance p-type high-density extension diffused layers 106 can be formed without fail, and further a semiconductor device including fine MIS transistors having high driving force can be formed.

Moreover, all of the p-type extension implanted layers 106A, the n-type pocket impurity implanted layers 107A and the fluorine implanted layers 109 are formed at doses with which the semiconductor substrate 100 is kept from becoming amorphous. Therefore, the high-density source/drain diffused layers 105 of the resultant MIS transistor are free from a residual defect layer such as an end of range (EOR) defect. This can reduce occurrence of junction leakage caused by such a residual defect layer. The EOR defect as used herein refers to a defect layer that may be produced in the vicinity of the position (in the depth) of an amorphous-crystal interface formed immediately after ion implantation if the semiconductor substrate is subjected to heat treatment in an amorphous state. In this embodiment, therefore, a semiconductor device including fine MIS transistors having high driving force and reduced junction leakage can be provided.

(Embodiment 2)

FIGS. 4A to 4E and 5A to 5D are cross-sectional views for sequentially illustrating process steps of a fabrication method for a semiconductor device of Embodiment 2 of the present invention.

Figure 4A:
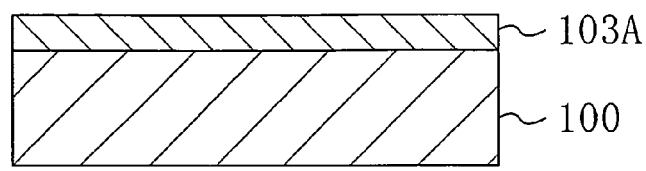
FIGS. 4A to 4E are cross-sectional views for sequentially illustrating process steps of a fabrication method for a semiconductor device of Embodiment 2 of the present invention.

First, as shown in FIG. 4A, arsenic (As) ions as n-type impurities are implanted in a channel formation region of a semiconductor substrate 100 made of p-type silicon under the conditions of an implantation energy of 70 keV and an implantation dose of $5\times10^{12}/cm^2$, to form an n-type channel implanted layer 103A in the top portion of the semiconductor substrate 100. Subsequently, phosphorus (P) ions as n-type impurities are implanted in an n-type well formation region of the semiconductor substrate 100 twice, first under the first implantation conditions of an implantation energy of 260 keV and an implantation dose of $1\times10^{13}/cm^2$ and then under the second implantation conditions of an implantation energy of 540 keV and an implantation dose of $1\times10^{13}/cm^2$, to form an n-type well implanted layer (not shown) in a portion of the semiconductor substrate 100 under the n-type channel implanted layer 103A.

Figure 4B:
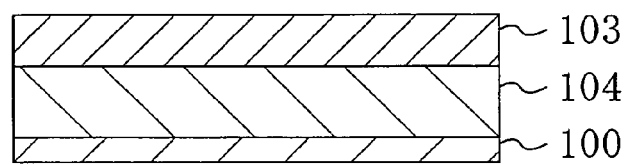

As shown in FIG. 4B, the semiconductor substrate 100 having the n-type channel implanted layer 103A and the n-type well implanted layer is subjected to first rapid thermal annealing (RTA) in which the temperature of the semiconductor substrate 100 is raised to about 850° C. to about 1050° C. at a rise rate of about 100° C./s or more, preferably about 200° C./s, and then the peak temperature is held for ten seconds at the longest or is not held at all. With the first RTA, an n-type channel diffused layer 103, made from diffusion of the arsenic ions implanted in the n-type channel implanted layer 103A, is formed in the top portion of the semiconductor substrate 100. Simultaneously, an n-type well diffused layer 104, made from diffusion of the phosphorus ions implanted in the n-type well implanted layer is formed in a portion under the n-type channel diffused layer 103 to be in contact with the n-type channel diffused layer 103.

Figure 4C:
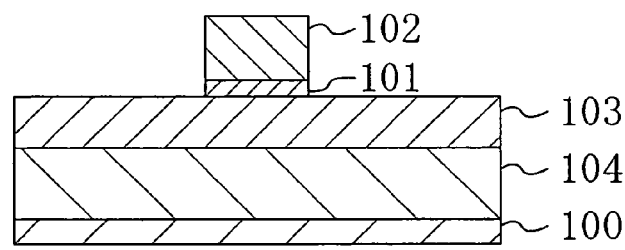

As shown in FIG. 4C, a silicon oxide film having a thickness of about 1.5 nm is formed on the semiconductor substrate 100 by thermal oxidation, for example, and subsequently a polysilicon film having a thickness of about 150 nm is formed on the silicon oxide film by chemical vapor deposition (CVD). The silicon oxide film and the polysilicon film are then patterned by photolithography and dry etching, to form a gate insulating film 101 and a gate electrode 102, respectively. As the etching gas, a gas containing chlorine as a main ingredient is used for the polysilicon film, and a gas containing fluorocarbon as a main ingredient is used for the silicon oxide film. In place of the silicon oxide film, a silicon oxide nitride (SiON) film or a high dielectric insulating film (high-k film) such as a hafnium oxide ($HfO_x$) film may be used as the gate insulating film 101. In place of the polysilicon film, a polymetal film may be used as the gate electrode 102.

Figure 4D:
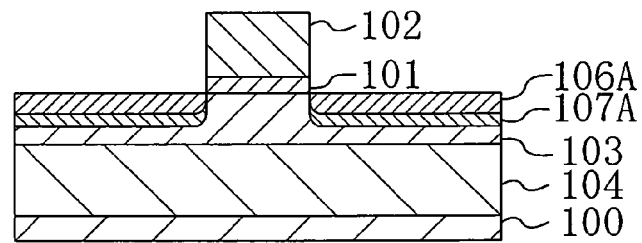

As shown in FIG. 4D, arsenic (As) ions as n-type impurities are implanted in the semiconductor substrate 100 using the gate electrode 102 as a mask under the conditions of an implantation energy of 50 keV to 150 keV, preferably 80 keV, and an implantation dose of $4\times10^{13}/cm^2$, to form n-type pocket impurity implanted layers 107A in regions of the semiconductor substrate 100 on both sides of the gate electrode 102. Subsequently, boron (B) ions as p-type impurities are implanted in the semiconductor substrate 100 using the gate electrode 102 as a mask under the conditions of an implantation energy of 1 keV and an implantation dose of $3\times10^{14}/cm^2$, to form p-type extension implanted layers 106A in the top portions of the n-type pocket impurity implanted layers 107A of the semiconductor substrate 100. The p-type extension implanted layers 106A and the n-type pocket impurity implanted layers 107A are preferably shallower than the junction of the n-type channel diffused layer 103. The dose of boron ions for formation of the p-type extension implanted layers 106A and the dose of arsenic ions for formation of the n-type pocket impurity implanted layers 107A are preferably in the level at which the semiconductor substrate 100 is kept from becoming amorphous.

Figure 4E:
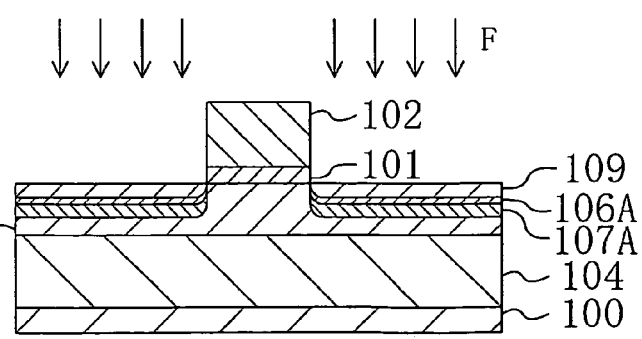

As shown in FIG. 4E, fluorine (F) ions are implanted in the semiconductor substrate 100 using the gate electrode 102 as a mask under the conditions of an implantation energy of 2 keV and an implantation dose of $5\times10^{13}/cm^2$, to form fluorine implanted layers 109 in the top portions of the p-type extension implanted layers 106A. The fluorine dose in this implantation should be not less than $1\times10^{13}/cm^2$ and also in the level at which the semiconductor substrate 100 is kept from becoming amorphous, preferably, less than $3\times10^{14}/cm^2$. The implantation projected range of fluorine should be less than five times as large as the range of boron in the formation of the p-type extension implanted layers 106A, preferably roughly the same as the range of boron.

Figure 5A:
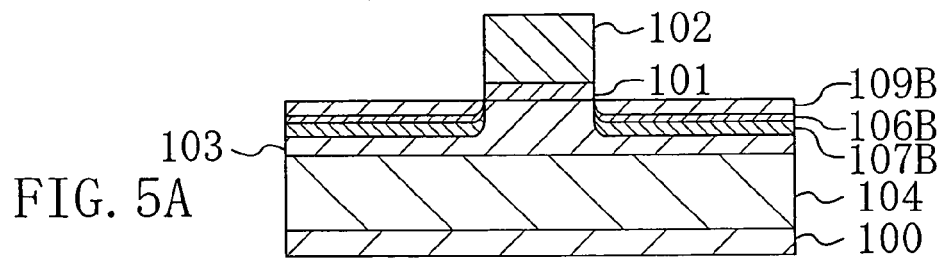
FIGS. 5A to 5D are cross-sectional views for sequentially illustrating process steps of the fabrication method for a semiconductor device of Embodiment 2 of the present invention.

As shown in FIG. 5A, the semiconductor substrate 100 having the p-type extension implanted layers 106A, the n-type pocket impurity implanted layers 107A and the fluorine implanted layers 109 is subjected to extremely low temperature heat treatment using a temperature extremely low for heat treatment in a semiconductor process, in which the temperature of the semiconductor substrate 100 is raised to about 400° C. to about 600° C. and held for about ten hours at the largest. By this extremely low temperature heat treatment, the p-type extension implanted layers 106A and the n-type pocket implanted layers 107A are respectively changed to p-type extension implanted annealed layers 106B and n-type pocket implanted annealed layers 107B, in which the impurities are hardly diffused but only crystal damage produced during the ion implantation is recovered.

Figure 5B:
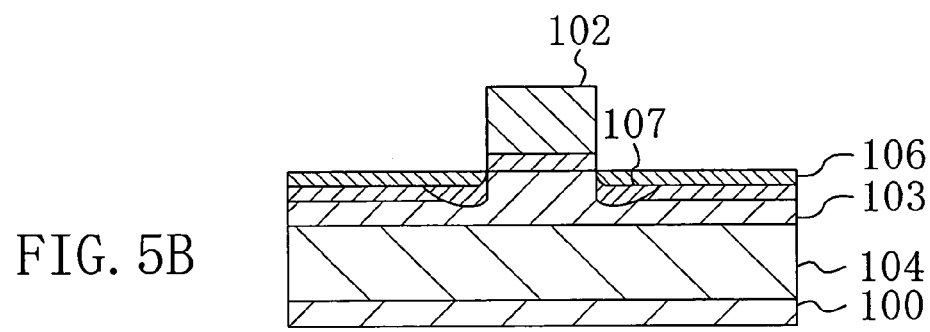

As shown in FIG. 5B, the resultant semiconductor substrate 100 is subjected to second rapid thermal annealing (RTA) in which the temperature of the semiconductor substrate 100 is raised to about 850° C. to about 1050° C. at a rise rate of about 100° C./s or more, preferably about 200° C./s, then the peak temperature is held for ten seconds at the longest or is not held at all, and the temperature is lowered at a drop rate of about 80° C./s. With the second RTA, p-type high-density extension diffused layers 106 having a shallow junction, made from diffusion of the boron ions contained in the p-type extension implanted annealed layers 106B, are formed in regions of the semiconductor substrate 100 on both sides of the gate electrode 102. Simultaneously, n-type pocket diffused layers 107, made from diffusion of the arsenic ions contained in the n-type pocket implanted annealed layers 107B, are formed in regions under the extension diffused layers 106 to be in contact with the extension diffused layers 106.

Figure 5C:
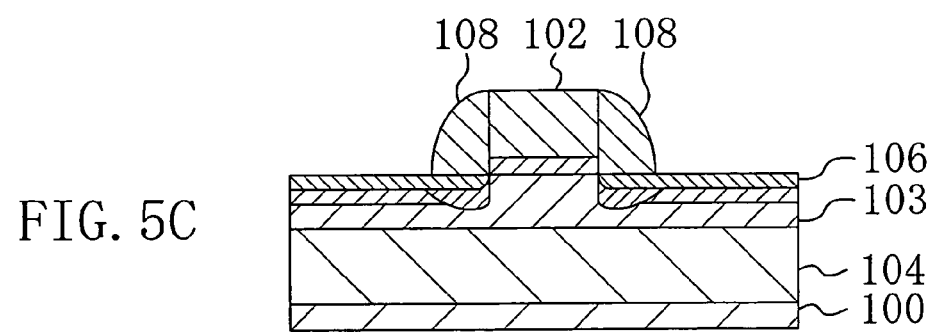

As shown in FIG. 5C, a silicon nitride film having a thickness of about 50 nm is deposited over the entire top surface of the semiconductor substrate 100 including the gate electrode 102 by CVD, for example. The deposited silicon nitride film is then subjected to anisotropy etching with a gas containing fluorocarbon as a main ingredient, to form sidewalls 108 made of the silicon nitride film on both walls of the gate electrode 102. In place of the silicon nitride film, a silicon oxide film or a silicon oxide nitride film may be used as the sidewalls 108. Otherwise, a laminate film composed of at least two films among a silicon nitride film, a silicon oxide film and a silicon oxide nitride film may be used.

Figure 5D:
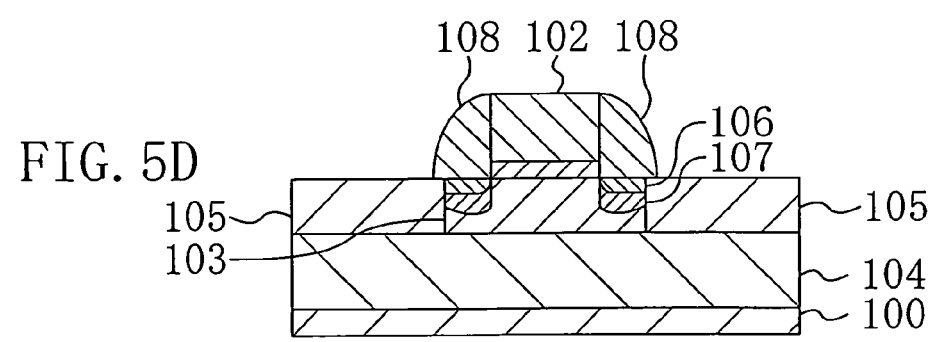

As shown in FIG. 5D, boron as p-type impurities are implanted in the semiconductor substrate 100 using the gate electrode 102 and the sidewalls 108 as a mask under the conditions of an implantation energy of 2 keV to 5 keV and an implantation dose of $3\times10^{15}/cm^2$, to form p-type high-density source/drain implanted layers in regions of the semiconductor substrate 100 on the outer sides of the sidewalls 108. The resultant semiconductor substrate 100 is subjected to third rapid thermal annealing (RTA) in which the temperature of the semiconductor substrate 100 is raised to about 850° C. to about 1050° C. at a rise rate of about 200° C./s to 250° C./s, and then the peak temperature is held for ten seconds at the longest or is not held at all. With the third RTA, p-type high-density source/drain diffused layers 105, made from diffusion of the boron ions in the high-density source/drain implanted layers, are formed in regions of the semiconductor substrate 100 on both outer sides of the sidewalls 108. The p-type high-density source/drain diffused layers 105 are connected with the p-type high-density extension diffused layers 106 and have a junction deeper than the extension diffused layers 106. The junction of the p-type high-density source/drain diffused layers 105 should also be deeper than the junction of the n-type pocket diffused layers 107. As a result, the p-type high-density extension diffused layers 106 and the n-type pocket diffused layers 107 exist only under the sidewalls 108.

The density of fluorine in the extension regions in Embodiment 2 is low after the formation of the p-type high-density source/drain diffused layers 105 shown in FIG. 5D, compared with the density immediately after the implantation of fluorine shown in FIG. 4E, due to out-diffusion of fluorine during the heat treatment such as the second RTA performed in between. A measurable amount of fluorine atoms however still remain in the surface portion of the semiconductor substrate 100.

FIGS. 6A to 6C show impurity concentration profiles in the depth direction from the substrate surface in some steps of the fabrication method for a semiconductor device of Embodiment 2. FIG. 6A shows the impurity concentration profiles of boron and fluorine observed after the ion implantation, in which the solid line represents the boron concentration distribution in the p-type extension implanted layers 106A in FIG. 4D, and the broken line represents the fluorine concentration distribution in the fluorine implanted layers 109 in FIG. 4E.

FIG. 6B shows the impurity concentration profiles observed after the extremely low temperature heat treatment, in which the solid line represents the boron concentration distribution in the p-type extension implanted annealed layers 106B in FIG. 5A, and the broken line represents the fluorine concentration distribution in the fluorine implanted annealed layers 109B in FIG. 5A.

FIG. 6C shows the impurity concentration profiles observed after the activation heat treatment, in which the solid line represents the boron concentration distribution in the p-type high-density extension diffused layers 106 in FIG. 5B, and the broken line represents the concentration distribution of residual fluorine in FIG. 5B.

A feature of Embodiment 2 is that the extremely low temperature heat treatment at a temperature of about 400° C. to about 600° C. is performed in the step shown in FIG. 5A after the implantation of fluorine ions, to recover crystal damage layers produced in the respective steps of ion implantation of arsenic, boron and fluorine. In a semiconductor process, the extremely low temperature range, which is a range of the order of 400° C., is a temperature range in which a solid-phase regrowth phenomenon known as solid-phase epitaxial regrowth occurs when the semiconductor substrate is amorphous.

As is found from the impurity concentration profiles after the extremely low temperature heat treatment shown in FIG. 6B, in comparison with the impurity concentraiton profiles immediately after the ion implantation shown in FIG. 6A, dopants normally used are hardly diffused by the extremely low temperature heat treatment because the diffusion coefficients of such dopants are sufficiently small compared with the diffusion coefficients of point defects. However, the fluorine contained in the fluorine implanted layers 109, which is not normally used as a dopant, diffuses rapidly even in the extremely low temperature range of about 400° C. Hence, by performing heat treatment in this extremely low temperature range, point defects and fluorine can be selectively diffused. In other words, fluorine diffuses while interacting with point defects. In this way, most of excessive point defects produced during the ion implantation can be eliminated during the extremely low temperature heat treatment. Moreover, as described above, the position of the junction of the p-type extension implanted annealed layers 106B little changes by the extremely low temperature heat treatment from the position observed immediately after the ion implantation.

The extremely low temperature heat treatment only is insufficient for activation of the implanted phosphorus and boron impurities. Therefore, after the extremely low temperature heat treatment, rapid thermal annealing such as spike RTA and flash lamp annealing is performed in the step shown in FIG. 5B, to activate the impurities. In Embodiment 2, the second RTA is performed after the sufficient elimination of excessive point defects by the extremely low temperature heat treatment. Hence, TED-induced abnormal diffusion of impurities can be suppressed as shown in FIG. 6C. As a result, activation of impurities can be attained while the steep impurity profile and the shallow junction are maintained.

As described above, in the fabrication method for a semiconductor device of Embodiment 2, boron ion implantation for formation of the p-type extension implanted layers 106A is performed at an energy as low as 1 keV, and then fluorine ions are implanted at a comparatively low dose of $5 \times 10^{13}/cm^2$ forming the fluorine implanted layers 109. The semiconductor substrate 100 is then subjected to the extremely low temperature heat treatment at about 400° C. to about 600° C., to recover implantation damage produced in the semiconductor substrate 100 due to the ion implantation. Thereafter, the high-temperature second RTA is performed to activate the boron doped in the p-type extension implanted annealed layers 106B. By following the above process steps, the TED of boron can be suppressed. Since this prevents expansion of the junction of the p-type high-density extension diffused layers 106 in the depth direction, the p-type high-density extension diffused layers 106 having a shallow junction can be formed. In addition, since diffusion of boron toward the surface of the semiconductor substrate 100 is also suppressed, the boron dose loss is suppressed. For example, the effect of suppressing the boron dose loss can be obtained by setting the fluorine dose at $1 \times 10^{14}/cm^2$ or less.

Thus, in this embodiment, by forming the boron-doped p-type extension implanted layers 106A and then implanting fluorine in the semiconductor substrate 100 at a dose that is not less than $1 \times 10^{13}/cm^2$ and also in the level at which the semiconductor substrate 100 is kept from becoming amorphous, it is possible to form, without fail, the low-resistance p-type high-density extension diffused layers 106 in which the boron impurity profile is steep, the junction is shallow, and increase in resistance value due to dose loss is suppressed.

Moreover, the extremely low temperature heat treatment is performed in the fluorine-doped state, and thereafter the high-temperature activation heat treatment is performed. Therefore, damage layers produced due to ion implantation can be recovered as crystal layers, and thus the number of residual defects decreases. As a result, leak current that may occur due to residual defects produced by implantation damage can be prevented.

(Embodiment 3)

FIGS. 7A to 7E and 8A to 8D are cross-sectional views for sequentially illustrating process steps of a fabrication method for a semiconductor device of Embodiment 3 of the present invention.

Figure 7A:
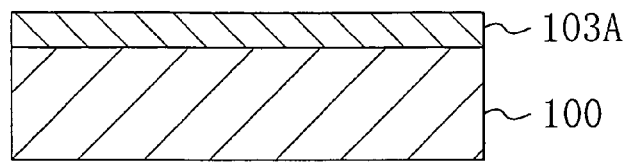
FIGS. 7A to 7E are cross-sectional views for sequentially illustrating process steps of a fabrication method for a semiconductor device of Embodiment 3 of the present invention.

First, as shown in FIG. 7A, arsenic (As) ions as n-type impurities are implanted in a channel formation region of a semiconductor substrate 100 made of p-type silicon under the conditions of an implantation energy of 70 keV and an implantation dose of $5 \times 10^{12}/cm^2$, to form an n-type channel implanted layer 103A in the top portion of the semiconductor substrate 100. Subsequently, phosphorus (P) ions as n-type impurities are implanted in an n-type well formation region of the semiconductor substrate 100 twice, first under the first implantation conditions of an implantation energy of 260 keV and an implantation dose of $1 \times 10^{13}/cm^2$ and then under the second implantation conditions of an implantation energy of 540 keV and an implantation dose of $1 \times 10^{13}/cm^2$, to form an n-type well implanted layer (not shown) in a portion of the semiconductor substrate 100 under the n-type channel implanted layer 103A.

Figure 7B:
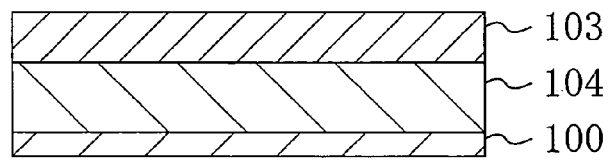

As shown in FIG. 7B, the semiconductor substrate 100 having the n-type channel implanted layer 103A and the n-type well implanted layer is subjected to first rapid thermal annealing (RTA) in which the temperature of the semiconductor substrate 100 is raised to about 850° C. to about 1050° C. at a rise rate of about 100° C./s or more, preferably about 200° C./s, and then the peak temperature is held for ten seconds at the longest or is not held at all. With the first RTA, an n-type channel diffused layer 103, made from diffusion of the arsenic ions implanted in the n-type channel implanted layer 103A, is formed in the top portion of the semiconductor substrate 100. Simultaneously, an n-type well diffused layer 104, made from diffusion of the phosphorus ions implanted in the n-type well implanted layer, is formed in a portion under the n-type channel diffused layer 103 to be in contact with the n-type channel diffused layer 103.

Figure 7C:
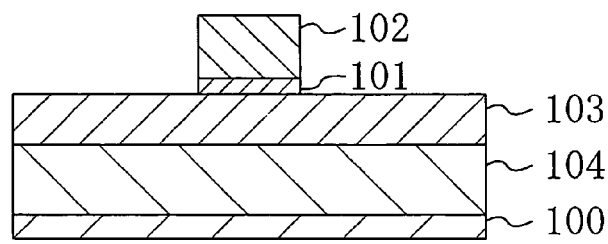

As shown in FIG. 7C, a silicon oxide film having a thickness of about 1.5 nm is formed on the semiconductor substrate 100 by thermal oxidation, for example, and subsequently a polysilicon film having a thickness of about 150 nm is formed on the silicon oxide film by chemical vapor deposition (CVD). The silicon oxide film and the polysilicon film are then patterned by photolithography and dry etching, to form a gate insulating film 101 and a gate electrode 102, respectively. As the etching gas, a gas containing chlorine as a main ingredient is used for the polysilicon film, and a gas containing fluorocarbon as a main ingredient is used for the silicon oxide film. In place of the silicon oxide film, a silicon oxide nitride (SiON) film or a high dielectric insulating film (high-k film) such as a hafnium oxide ($HfO_x$) film may be used as the gate insulating film 101. In place of the polysilicon film, a polymetal film may be used as the gate electrode 102.

Figure 7D:
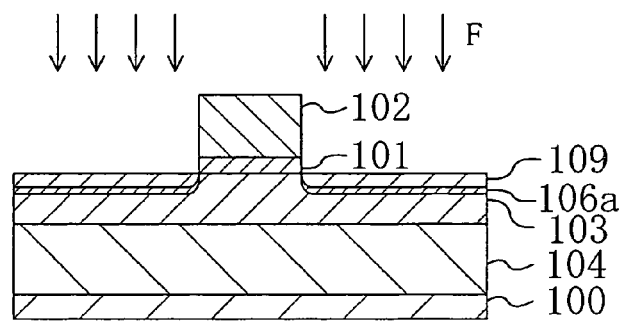

As shown in FIG. 7D, boron (B) ions as p-type impurities are implanted in the semiconductor substrate 100 using the gate electrode 102 as a mask under the conditions of an implantation energy of 0.5 keV and an implantation dose of $5 \times 10^{13}/cm^2$, to form p-type implanted layers 106a in the top portions of the semiconductor substrate 100. Subsequently, fluorine (F) ions are implanted in the semiconductor substrate 100 using the gate electrode 102 as a mask under the conditions of an implantation energy of 2 keV and an implantation dose of $1 \times 10^{13}/cm^2$, to form fluorine implanted layers 109 in the top portions of the p-type implanted layers 106a.

Figure 7E:
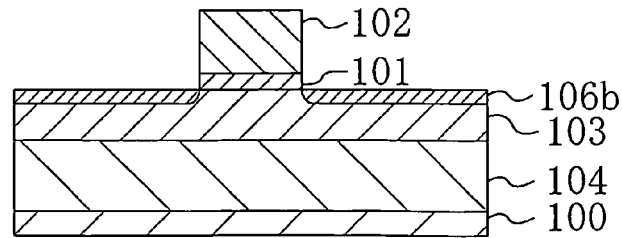

As shown in FIG. 7E, the resultant semiconductor substrate 100 is subjected to second rapid thermal annealing (RTA) in which the temperature of the semiconductor substrate 100 is raised to about 850° C. to about 1050° C. at a rise rate of about 100° C./s or more, preferably about 200° C./s, then the peak temperature is held for ten seconds at the longest or is not held at all, and the temperature is lowered at a drop rate of about 80° C./s. With the second RTA, the implanted fluorine ions are diffused toward the surface of the semiconductor substrate 100 and further outside thereof, and p-type diffused layers 106b having a shallow junction are formed in regions of the semiconductor substrate 100 on both sides of the gate electrode 102.

Figure 8A:
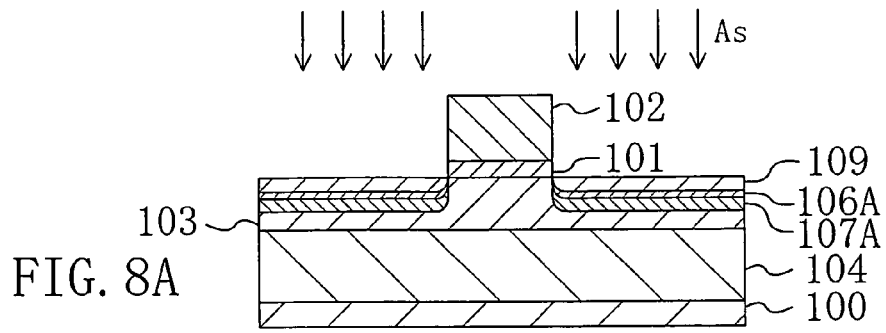
FIGS. 8A to 8D are cross-sectional views for sequentially illustrating process steps of the fabrication method for a semiconductor device of Embodiment 3 of the present invention.

In Embodiment 3, the steps shown in FIGS. 7D and 7E, that is, the ion implantation of boron and fluorine and the second RTA, are taken as one process unit, and this process unit is repeated a plurality of times, for example, six times. By the repetition of this process unit, in which boron is implanted in the p-type implanted layers 106a six times, p-type extension implanted layers 106A having a predetermined impurity concentration can be obtained as shown in FIG. 8A. The number of times of repetition of the process unit is not limited to six. However, the process unit must be repeated until the predetermined impurity concentration is obtained, and the ion implantation must be performed at a dose with which no amorphous layer will be formed in the semiconductor substrate 100 by each time of ion implantation of boron and fluorine. Also, after each of the plurality of times of ion implantation, the high-temperature, short-time RTA must be performed. Hereinafter, the plurality of times, for example, six times of RTA are simply called the second RTA collectively, for convenience.

As shown in FIG. 8A, after formation of the fluoride implanted layers 109 as a result of the last-time fluorine implantation in the repetition of the process unit, arsenic (Ar) ions as n-type impurities are implanted in the semiconductor substrate 100 using the gate electrode 102 as a mask under the conditions of an implantation energy of 50 keV to 150 keV, preferably 80 keV and an implantation dose of $4 \times 10^{13}/cm^2$, to form n-type pocket impurity implanted layers 107A in regions of the semiconductor substrate 100 under the p-type extension implanted layers 106A.

Figure 8B:
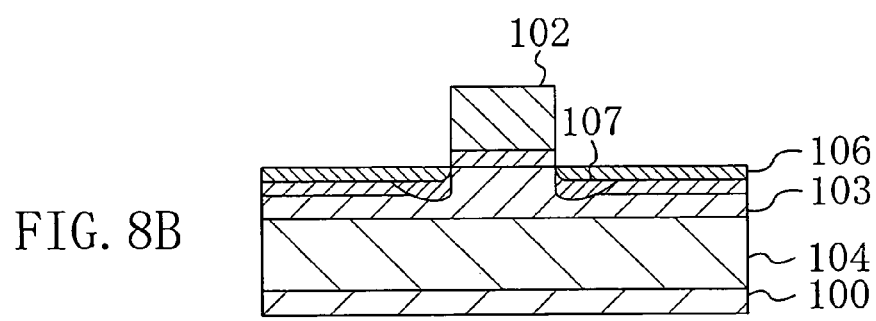

As shown in FIG. 8B, the last-time second RTA in the repetition of the process unit is performed, to form p-type high-density extension diffused layers 106 having a shallow junction, made from diffusion of the boron ions contained in the p-type extension implanted layers 106A, in regions of the semiconductor substrate 100 on both sides of the gate electrode 102. Also formed are n-type pocket diffused layers 107, made from diffusion of the arsenic ions contained in the n-type pocket implanted layers 107A, in regions under the extension diffused layers 106 to be in contact with the extension diffused layers 106.

Figure 8C:
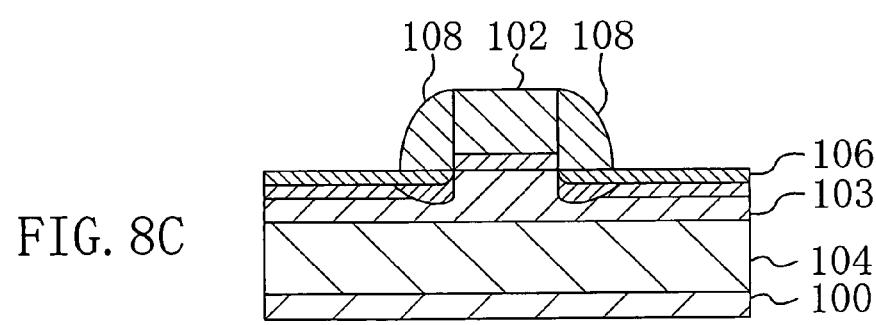

As shown in FIG. 8C, a silicon nitride film having a thickness of about 50 nm is deposited over the entire top surface of the semiconductor substrate 100 including the gate electrode 102 by CVD, for example. The deposited silicon nitride film is then subjected to anisotropy etching with a gas containing fluorocarbon as a main ingredient, to form sidewalls 108 made of the silicon nitride film on both walls of the gate electrode 102. In place of the silicon nitride film, a silicon oxide film or a silicon oxide nitride film may be used as the sidewall 108. Otherwise, a laminate film composed of at least two films among a silicon nitride film, a silicon oxide film and a silicon oxide nitride film may be used.

Figure 8D:
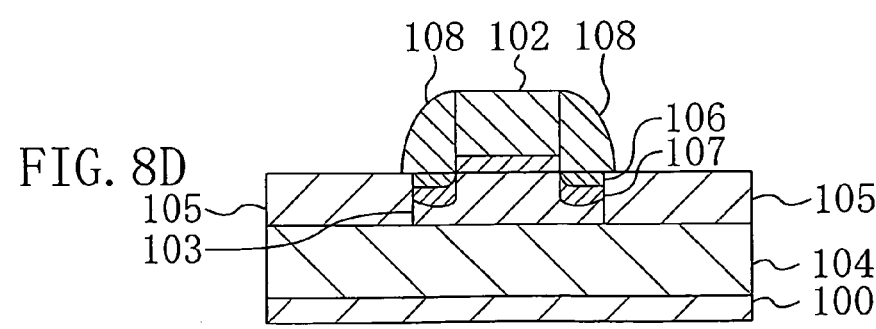
Figure 9A:
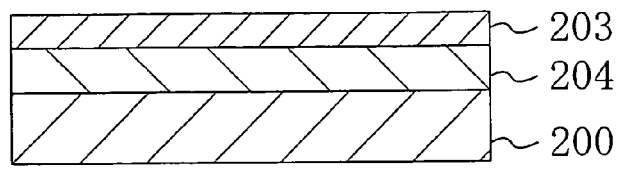
FIGS. 9A to 9D are cross-sectional views for sequentially illustrating process steps of a conventional fabrication method for a semiconductor device.
Figure 9B:
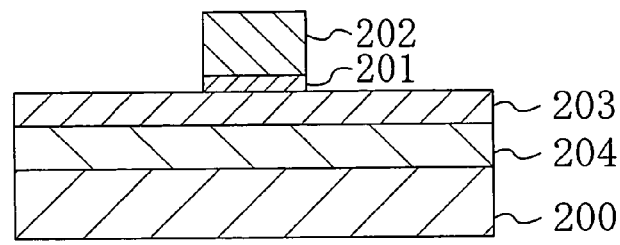
Figure 9C:
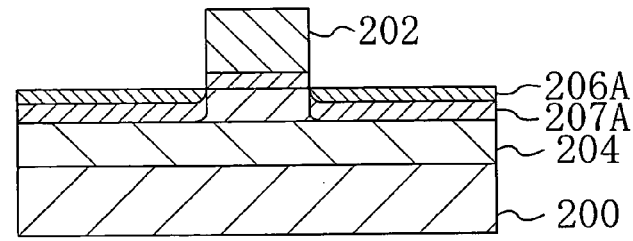
Figure 9D:
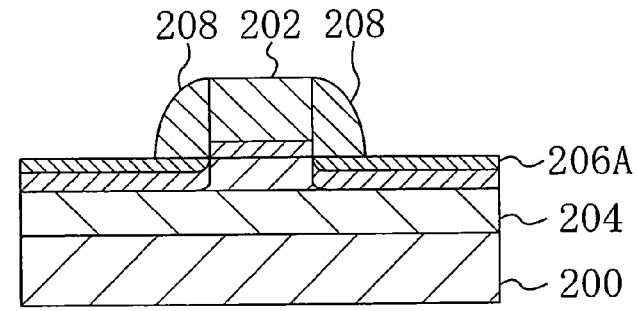
Figure 9E:
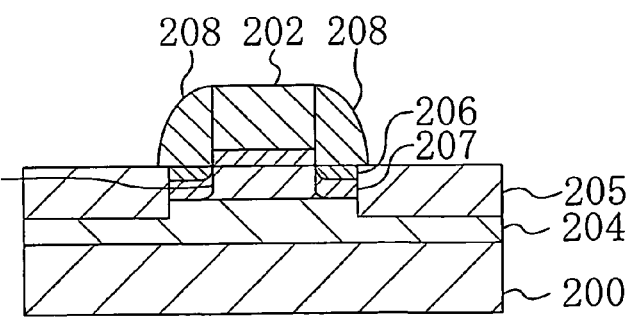

As shown in FIG. 8D, boron as p-type impurities are implanted in the semiconductor substrate 100 using the gate electrode 102 and the sidewalls 108 as a mask under the conditions of an implantation energy of 2 keV to 5 keV and an implantation dose of $3 \times 10^{15}/cm^2$, to form p-type high-density source/drain implanted layers in regions of the semiconductor substrate 100 on the outer sides of the sidewalls 108. The resultant semiconductor substrate 100 is subjected to third rapid thermal annealing (RTA) in which the temperature of the semiconductor substrate 100 is raised to about 850° C. to about 1050° C. at a rise rate of about 200° C./s to 250° C./s, and then the peak temperature is held for ten seconds at the longest or is not held at all. With the third RTA, p-type high-density source/drain diffused layers 105, made from diffusion of the boron ions in the high-density source/drain implanted layers, are formed in regions of the semiconductor substrate 100 on both outer sides of the sidewalls 108. The p-type high-density source/drain diffused layers 105 are connected with the p-type high-density extension diffused layers 106 and have a junction deeper than the extension diffused layers 106. The junction of the p-type high-density source/drain diffused layers 105 should also be deeper than the junction of the n-type pocket diffused layers 107. As a result, the p-type high-density extension diffused layers 106 and the n-type pocket diffused layers 107 exist only under the sidewalls 108.

The density of fluorine in the extension regions in Embodiment 3 is low after the formation of the p-type high-density source/drain diffused layers 105 shown in FIG. 8D, compared with the density immediately after the implantation of fluorine shown in FIG. 7D, due to out-diffusion of fluorine during the heat treatment such as the second RTA performed in between. A measurable amount of fluorine atoms however still remain in the surface portion of the semiconductor substrate 100.

As described above, in the fabrication method for a semiconductor device of Embodiment 3, one process unit composed of the boron implantation, the fluorine implantation and the activation RTA is repeated a plurality of times so that the p-type high-density extension diffused layers 106 having a predetermined impurity concentration can be formed in regions of the semiconductor substrate 100 under the sidewalls 108 on both walls of the gate electrode 102. In one time of ion implantation, boron and fluorine are respectively implanted at a dose with which the semiconductor substrate 100 is kept from becoming amorphous. As a result, it is possible to form, without fail, the low-resistance extension diffused layers 106 in which the junction is shallow and increase in resistance value due to dose loss is suppressed.

As described in Embodiment 1, optimum implantation conditions have been found for the implantation of fluorine performed for suppressing the TED of boron. For example, if the fluorine density is so high that the semiconductor substrate is made amorphous, the boron junction will become deep and also the boron dose loss will increase. This also applies to boron. In the case of formation of higher-density boron diffused layers, if boron is implanted at a dose high enough to allow the semiconductor substrate to become amorphous, it will be difficult to form shallow boron diffused layers even when fluorine is implanted in the semiconductor substrate.

In Embodiment 3, ion implantation of boron and fluorine is performed in a plurality of times, to prevent the semiconductor substrate from becoming amorphous by the ion implantation. During the second RTA for activation, therefore, boron and fluorine are diffused in the semiconductor substrate that is kept in the crystal state. Accordingly, with the effect of fluorine of suppressing diffusion of boron, the shallow p-type high-density extension diffused layers 106 can be attained.

In the case that the boron implantation energy is made lower in an attempt to make the p-type high-density extension diffused layers 106 shallower, the threshold of the dose with which the semiconductor substrate becomes amorphous also decreases. However, this problem of becoming amorphous at a lower dose when low implantation energy is adopted can be avoided by performing the ion implantation in a plurality of times, and performing the RTA every time of ion implantation to recover the crystallinity of the semiconductor substrate.

In Embodiments 1 to 3, the high-density source/drain diffused layers 105 were formed by first forming the p-type high-density source/drain implanted layers by one time of boron implantation and then performing the third RTA. Alternatively, as in the formation of the p-type high-density extension diffused layers 106 in Embodiment 3, they may be formed by repeating the process unit composed of the step of implanting boron and fluorine at doses with which the semiconductor substrate is kept from becoming amorphous and the subsequent step of performing the third RTA. In the ion implantation of boron and fluorine in a plurality of times, also, so-called rotating implantation may be adopted in which the angle of the ion implantation, for example, the twist angle is changed.

In Embodiments 1 to 3, boron (B) ions were used as the impurity ions for the p-type high-density source/drain diffused layers 105 and/or the p-type high-density extension diffused layers 106. Alternatively, indium (In) ions may be used instead.

In Embodiments 1 to 3, arsenic ions were used as the impurity ions for the n-type channel diffused layers 103. Alternatively, ions of an element that exhibits n-type conductivity and has a mass number greater than arsenic, such as antimony (Sb), may be used, or both ions of such an element and arsenic ions may be used.

P-channel MIS transistors were used to describe the semiconductor device of the present invention. Alternatively, n-channel MIS transistors may be used. In n-channel MIS transistors, n-type impurity ions constituting the extension diffused layers may be arsenic (As) ions or ions of any of group VB elements having a mass number greater than arsenic, such as antimony (Sb) ions and bismuth (Bi) ions.

In Embodiments 1 to 3, the sidewalls 108 were formed directly on the walls of the gate electrode 102. Alternatively, an offset spacer made of silicon oxide, which serves as an extension implantation mask, may be formed between the gate electrode 102 and each of the sidewalls 108.

The sidewalls 108 are not necessarily made of a single-layer film, but may be made of a laminate film composed of a silicon oxide film having a L-shaped cross section and a silicon nitride film formed on the silicon oxide film, for example.

As described above, the present invention can provide a semiconductor device including MIS transistors having low-resistance extension diffused layers in which the impurity profile is steep, the junction is shallow, and increase in resistance value due to dose loss is suppressed. Such a semiconductor device is usable as being a device that can be made finer and also has shallow-junction, low-resistance diffused layers.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A fabrication method for a semiconductor device comprising the steps of:
   (a) forming a gate electrode on a semiconductor region of a first conductivity type with a gate insulating film interposed therebetween;
   (b) forming extension implanted layers in the semiconductor region by implanting first impurities of a second conductivity type in the semiconductor region using the gate electrode as a mask and forming pocket implanted layers in the semiconductor region by implanting second impurities of the first conductivity type in the semiconductor region using the gate electrode as a mask;
   (c) after the step (b), forming fluorine implanted layers in upper portions of the extension implanted layers by implanting fluorine in the semiconductor region using the gate electrode as a mask;
   (d) after the step (c), forming extension diffused layers of the second conductivity type made from diffusion of the first impurities in top portions of the semiconductor region by performing first heat treatment and forming pocket diffused layers of the first conductivity type made from diffusion of the second impurities in portions of the semiconductor region under the extension diffused layers by performing the first heat treatment,
   (e) after the step (d), forming sidewalls made of an insulating film on walls of the gate electrode;
   (f) forming source/drain implanted layers in the semiconductor region by implanting third impurities of the second conductivity type in the semiconductor region using the gate electrode and the sidewalls as a mask; and
   (g) after the step (f), forming source/drain diffused layers of the second conductivity type made from diffusion of the third impurities in portions of the semiconductor region on the outer sides of the sidewall.

2. The method of claim 1, wherein the dose of fluorine in the step (c) is not less than $1\times10^{13}/cm^2$ and also in the level at which the semiconductor region is kept from becoming amorphous.

3. The method of claim 1, wherein the dose of fluorine in the step (c) is less than $3\times10^{14}/cm^2$.

4. The method of claim 1, wherein the implantation projected range of fluorine in the step (c) is roughly the same as the implantation projected range of the first impurities in the step (b).

5. The method of claim 1, wherein in the step (d), the fluorine in the fluorine implanted layers diffuses while interacting with point defects, so that excessive point defects induced in the semiconductor region are removed.

6. The method of claim 1, further comprising the step of:
   performing extremely low temperature heat treatment for the semiconductor region before the step (d) and after the step (c), to recover crystal damage produced in the semiconductor region due to the implantation of the first impurities and the fluorine without substantially allowing diffusion of the first impurities in the extension implanted layers.

7. The method of claim 6, wherein the extremely low temperature heat treatment has a heating temperature of 400° C. to 600° C.

8. The method of claim 1, wherein the first heat treatment in the step (d) is rapid thermal annealing in which the temperature rise rate is about 100° C./s or more, the temperature drop rate is about 80° C./s or more, the heating temperature is about 850° C. to 1050° C., and the peak temperature is held for about ten seconds at the longest or is not held at all.

9. The method of claim 1, wherein the first impurities in the step (b) are boron or indium.

10. The method of claim 1, wherein the first impurities in the step (b) are arsenic.

11. The method of claim 10, wherein during the first heat treatment in the step (d), the first impurities in the extension implanted layers diffuse in a state in which the fluorine has captured atomic vacancies produced in top portions of the semiconductor region.

12. The method of claim 1, wherein the dose for the implantation of the first impurities in the step (b) is in a level at which the semiconductor region is kept from becoming amorphous, and the extension diffused layers having a predetermined impurity concentration are formed by repeating a series of process steps composed of implanting the first impurities in the step (b), implanting fluorine in the step (c) and performing the first heat treatment in the step (d).

wherein the extension diffused layers are crystal layers that contain fluorine and are free from residual defects.

13. The method of claim 1, wherein the dose of fluorine in the step (c) is not less than $1 \times 10^{13}/cm^2$ and less than $3 \times 10^{14}/cm^2$.

14. The method of claim 1, wherein in the step (c), even when fluorine is implanted, the semiconductor region is kept from becoming amorphous.

* * * * *